United States Patent
Chaji et al.

(10) Patent No.: US 11,764,199 B2
(45) Date of Patent: Sep. 19, 2023

(54) SELF-ALIGNED VERTICAL SOLID STATE DEVICES FABRICATION AND INTEGRATION METHODS

(71) Applicant: VueReal Inc., Waterloo (CA)

(72) Inventors: Gholamreza Chaji, Waterloo (CA); Ehsanollah Fathi, Waterloo (CA)

(73) Assignee: VueReal Inc., Waterloo (CA)

( * ) Notice: Subject to any disclaimer, the term of this patent is extended or adjusted under 35 U.S.C. 154(b) by 0 days.

(21) Appl. No.: 16/546,897

(22) Filed: Aug. 21, 2019

(65) Prior Publication Data
US 2020/0161290 A1    May 21, 2020

Related U.S. Application Data

(60) Provisional application No. 62/767,698, filed on Nov. 15, 2018.

(51) Int. Cl.
| | |
|---|---|
| H01L 25/00 | (2006.01) |
| H01L 33/42 | (2010.01) |
| H01L 33/44 | (2010.01) |
| H01L 27/15 | (2006.01) |
| H01L 33/62 | (2010.01) |
| H01L 25/18 | (2023.01) |
| H01L 33/46 | (2010.01) |
| H01L 33/24 | (2010.01) |
| H01L 33/00 | (2010.01) |
| H01L 33/06 | (2010.01) |
| H01L 33/32 | (2010.01) |

(52) U.S. Cl.
CPC .............. *H01L 25/50* (2013.01); *H01L 25/18* (2013.01); *H01L 27/153* (2013.01); *H01L 33/0075* (2013.01); *H01L 33/0093* (2020.05); *H01L 33/24* (2013.01); *H01L 33/42* (2013.01); *H01L 33/44* (2013.01); *H01L 33/46* (2013.01); *H01L 33/62* (2013.01); *H01L 33/06* (2013.01); *H01L 33/32* (2013.01); *H01L 2933/0016* (2013.01); *H01L 2933/0025* (2013.01); *H01L 2933/0066* (2013.01)

(58) Field of Classification Search
None
See application file for complete search history.

(56) References Cited

U.S. PATENT DOCUMENTS

| | | | |
|---|---|---|---|
| 10,854,801 B1 | 12/2020 | Henry | |
| 10,964,829 B2* | 3/2021 | Zhao | ................. H01L 31/03044 |
| 2012/0273749 A1* | 11/2012 | Hsia | ....................... H01L 33/20 |
| | | | 257/13 |

(Continued)

*Primary Examiner* — Michelle Mandala
(74) *Attorney, Agent, or Firm* — NIXON PEABODY LLP

(57) ABSTRACT

Various embodiments include methods of fabricating an array of self-aligned vertical solid state devices and integrating the devices to a system substrate. The method of fabricating a self-aligned vertical solid state device comprising: providing a semiconductor substrate, depositing a plurality of device layers on the semiconductor substrate, depositing an ohmic contact layer on an upper surface of one of the plurality of device layers, wherein the device layers comprises an active layer and a doped conductive layer, forming a patterned thick conductive layer on the ohmic contact layer; and selectively etching down the doped conductive layer that does not substantially etch the active layer.

9 Claims, 15 Drawing Sheets

(56) References Cited

U.S. PATENT DOCUMENTS

| | | | |
|---|---|---|---|
| 2014/0021505 A1* | 1/2014 | Huang | H01L 33/02 |
| | | | 257/98 |
| 2014/0175506 A1* | 6/2014 | Tu | H01L 33/007 |
| | | | 257/101 |
| 2014/0203239 A1* | 7/2014 | Schubert | H01L 33/22 |
| | | | 257/13 |
| 2014/0264947 A1* | 9/2014 | Lin | H01L 21/768 |
| | | | 257/777 |
| 2015/0303655 A1* | 10/2015 | Han | H01S 5/34333 |
| | | | 372/45.012 |
| 2016/0172562 A1 | 6/2016 | Voutsas | |
| 2016/0372893 A1* | 12/2016 | McLaurin | H01S 5/32341 |
| 2017/0338389 A1* | 11/2017 | Zhan | H01L 33/06 |
| 2018/0108804 A1* | 4/2018 | Ellis | H04B 10/548 |
| 2018/0277719 A1* | 9/2018 | Lee | H01L 33/46 |
| 2019/0058080 A1 | 2/2019 | Ahmed | |
| 2019/0131281 A1 | 5/2019 | Liu | |
| 2020/0035859 A1* | 1/2020 | Park | H01L 33/387 |
| 2020/0127173 A1* | 4/2020 | Park | H01L 33/52 |

* cited by examiner

SELF-ALIGNED VERTICAL SOLID STATE DEVICES FABRICATION AND INTEGRATION METHODS

CROSS-REFERENCE TO RELATED APPLICATION(S)

This application claims priority to and the benefit of U.S. Provisional Patent Application Ser. No. 62/767,698, filed Nov. 15, 2018, which is hereby incorporated by reference herein in its entirety.

FIELD OF THE INVENTION

The present invention relates generally to vertical solid state devices and methods of manufacture thereof. More particularly, the present invention relates to a method of fabricating a self-aligned vertical solid state devices. The present invention also relates to the self-aligned integration of an array of microdevices to an array of contacts on a receiver substrate or a system substrate.

BACKGROUND

Light emitting diodes (LEDs) and LED arrays can be categorized as vertical solid state devices. The microdevices may be sensors, LEDs, or any other solid devices grown, deposited, or monolithically fabricated on a substrate. The substrate may be the native substrate of the device layers or a receiver substrate where device layers or solid state devices are transferred to.

The system substrate may be any substrate and can be rigid or flexible. The system substrate may be made of glass, silicon, plastics, or any other commonly used material. The system substrate may also have active electronic components such as but not limited to transistors, resistors, capacitors, or any other electronic component commonly used in a system substrate. In some cases, the system substrate may be a substrate with electrical signal rows and columns. In one example, the device substrate may be a sapphire substrate with LED layers grown monolithically on top of it and the system substrate may be a backplane with circuitry to derive microLED devices.

Forming and patterning of microLED devices may require a plurality of complex and costly photolithography steps which also requires a perfect mask alignment. Also, these steps are laborious and there are high chances of inaccuracies possible during photolithography steps. These inaccuracies may reduce or harm the operating characteristics of the device, which may result in a decrease in yields. Accordingly, it would be desirable to simplify the process steps required for device fabrication, while offering a perfect alignment between different patterns.

Furthermore, LED devices on a wafer substrate can be bonded to a receiver substrate/an electronic backplane which drives these devices or pixels in a passive or active manner. However, the alignment between the two substrates (i.e. wafer substrate and system substrate) is challenging because of different size (microdevices and contact pads) and coefficient of thermal expansion in both substrates. Moreover, it is very difficult to develop a bonding process to hermetically seal the microLED substrate with the receiver substrate.

Also, patterning LEDs into micro size devices to create an array of LEDs for display applications comes with several issues including material utilization, limited PPI, and defect creation. There remains a need for efficient vertical solid state devices.

SUMMARY OF THE INVENTION

According to one objective of the present invention is to provide a simplified single step lithography process to fabricate vertical solid state devices.

According to another objective of the present invention is to provide a self-aligned fabrication process to fabricate vertical solid state devices by simplifying and reducing the complexity of the photolithography steps.

According to yet another objective of the present invention is to provide a uniform, reliable and hermetically sealed (bubble free) bonding process between a microdevice substrate and a system substrate.

According to one embodiment, a self-aligned fabrication process for vertical solid state devices may be provided. The self-aligned fabrication process and structures enhance the production yield by eliminating misalignment issue.

In one embodiment, there is provided a method of fabricating a self-aligned vertical solid state device. The method may comprising depositing a plurality of device layers on the semiconductor substrate, depositing an ohmic contact layer on an upper surface of one of the plurality of device layers, wherein the device layers comprises an active layer and a doped conductive layer, forming a patterned thick conductive layer on the ohmic contact layer; and selectively etching down the doped conductive layer that does not substantially etch the active layer.

In another embodiment, there is provided a method of manufacturing an optoelectronic panel. The method may comprising fabricating an array of microdevices on a semiconductor substrate, providing a system substrate with contact pads where a pitch of the microdevice array is smaller than a pitch of the contact pads on the system substrate, approximately aligning the array of microdevices on the semiconductor substrate with the contact pads on the system substrate; and bonding the microdevices to the system substrate.

According to another embodiment, the self-aligned integration process provides an alignment accuracy requirement without compromising microLED performance.

BRIEF DESCRIPTION OF THE FIGURES

The foregoing and other advantages of the disclosure will become apparent upon reading the following detailed description and upon reference to the drawings.

Use of the same reference numbers in different figures indicate similar or identical elements.

DETAILED DESCRIPTION OF THE INVENTION

Figure 1A:
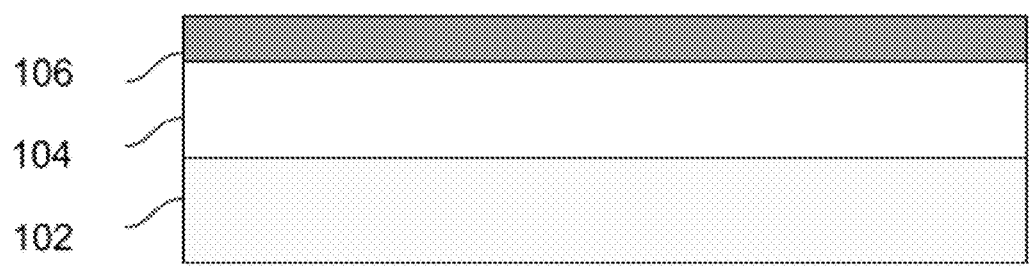
FIGS. 1A-1B illustrate a cross-sectional view of a fabrication process of a vertical solid state structure, in accordance with an embodiment of the invention.

Unless defined otherwise, all technical and scientific terms used herein have the same meaning as commonly understood by one of ordinary skill in the art to which this invention belongs.

As used in the specification and claims, the singular forms "a", "an", and "the" include plural references unless the context clearly dictates otherwise.

The term "comprising" as used herein will be understood to mean that the list following is non-exhaustive and may or may not include any other additional suitable items, for example, one or further feature(s), component(s) and/or element(s) as appropriate.

The terms "device", "microdevice", "vertical solid state device", and "optoelectronic device" are used herein interchangeably. It would be clear to one skilled in the art that the embodiments described herein are independent of the device size.

The terms "system substrate", "receiver substrate" and "backplane" are used herein interchangeably. However, it is clear to one skilled in the art that the embodiments described herein are independent of substrate type.

The terms "donor substrate", "wafer substrate" and "semiconductor substrate" are used herein interchangeably. However, it is clear to one skilled in the art that the embodiments described herein are independent of substrate type.

The present invention relates to methods to fabricate self-aligned vertical solid state devices, particularly optoelectronic devices. More specifically, the present disclosure relates to the fabrication of self-aligned micro or nano-optoelectronic devices in which a single lithography step may be employed. Also, described is a method of creating an array of self-aligned vertical solid state devices by simplifying and reducing the complexity of the photolithography steps.

The disclosed methods and structures increase the number of LED devices fabricated within a limited wafer area and result in lower fabrication costs and decrease the number of fabrication steps. LED devices in a substrate can be bonded to an electronic backplane which drives these devices or pixels in a passive or active manner. Although the following methods are explained with one type of LED device, they can be easily used with other LED and non-LED vertical devices, such as sensors. LED devices in a substrate as herein described can be bonded to an electronic backplane which drives these devices (pixels) in a passive or active manner and provides a uniform, reliable, hermetically sealed (bubble free) and high yield bonding process between microdevices and system substrate.

Various embodiments in accordance with the present structures and processes provided are described below in detail.

In general, LEDs are fabricated by depositing a stack of material on a substrate such as sapphire. A conventional gallium nitride (GaN) LED device includes a substrate, such as sapphire, an n-type GaN layer formed on the substrate or a buffer layer (for example GaN). The device layers include an active layer such as a multiple quantum well (MQW) layer and a p-type GaN layer. The microdevice may be fabricated from but its fabrication is not limited to GaN, InGaN, GaP, AlGaAs, GaAs, InGaAsP, GaAsP, AlGaInP, InP, or SiC. A transparent conductive layer such as Ni/Au or indium tin oxide (ITO) is usually formed on the p-doped GaN layer for a better lateral current conduction. Conventionally, the p-type electrode such as Pd/Au, Pt or Ni/Au is then formed on the transparent conductive layer. In some cases, the n-type layer may also be exposed to make a contact to this layer. This step is usually done using a dry etch process to expose the n-type layer and then deposit the appropriate metal contacts. The metal layer can be patterned using liftoff process or etching. This conventional process requires many lithography steps and at each step precise mask alignment is needed.

The present disclosure relates to the fabrication of micro or nano-optoelectronic devices in which a single lithography step may be employed.

Also, described is a method of creating an array of self-aligned vertical solid state devices by simplifying and reducing the complexity of the photolithography steps.

FIG. 1A illustrates a cross-sectional view of a fabrication process of a vertical solid state structure, in accordance with an embodiment of the invention. Here, a substrate 102 may be provided. A plurality of device layers 104 may be formed on the substrate 102. The device layers 104 may comprise an active (device) layer and a doped conductive layer 106. The conductive layer may be formed over an upper surface of one of a plurality of device layers. The doped conductive layer may comprise one of an n-type layer or a p-type layer.

Figure 1B:
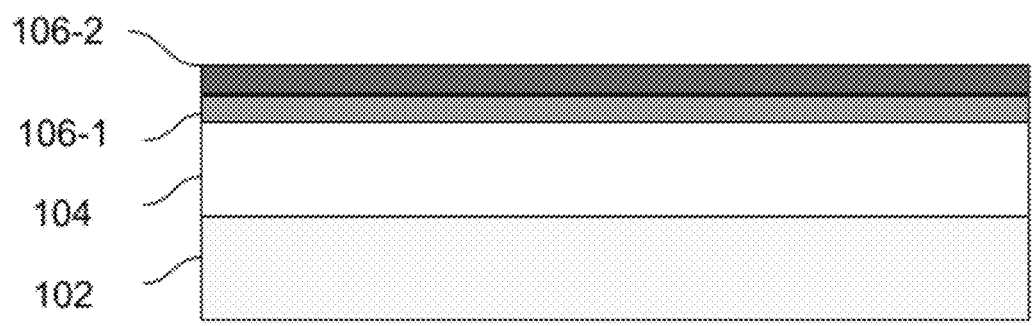

FIG. 1B illustrates a cross-sectional view of a fabrication process of a vertical solid state structure, in accordance with an embodiment of the invention. The conductive layer 106 may comprise a thick metal/conductive layer and an ohmic contact layer. The ohmic contact layer 106-1 may be deposited on the upper surface of one of a plurality of device layers and a thick conductive layer 106-2 may be deposited on the ohmic contact layer. The metal deposition may be employed using a variety of methods such as thermal evaporation, e-beam deposition, and sputtering. The conductive layer can also be a combination of different metals, conductive materials, or layers. In one embodiment, the thick conductive layer 106-2 provided over the ohmic contact layer 106-1 can be used as a bump for bonding the vertical devices to a system substrate or a backplane. The ohmic contact layer 106-1 may comprise a common transparent electrode including, but not limited to indium tin oxide (ITO) and aluminum doped zinc oxide as another ohmic contact. The thick conductive layer 106-2 made of materials such as Ni/Au, Cr/Au or Ti/Au can be formed over the ohmic contact layer.

FIGS. 2A-2D illustrate a cross-sectional view of a fabrication process of a vertical solid state structure, in accordance with an embodiment of the invention.

Figure 2A:
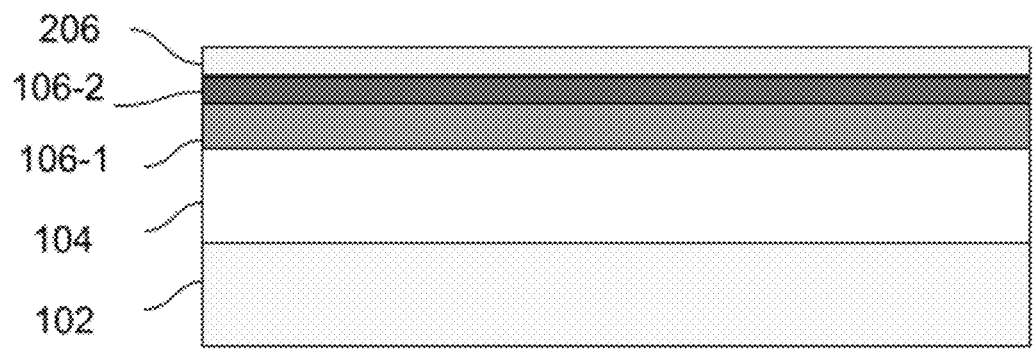
FIGS. 2A-2D illustrate a cross-sectional view of a fabrication process of a vertical solid state structure, in accordance with an embodiment of the invention.

FIG. 2A shows a vertical solid state structure with a hard mask layer deposition on the thick conductive layer, in accordance with an embodiment of the invention. A hard mask layer 206 may be deposited on the thick conductive layer 106-2. The hard mask layer/masking layer 206 includes $SiO_2$ or another suitable material. The hard mask layer may be deposited on the thick metal layer 106-2 by physical vapor deposition (PVD), chemical vapor deposition (CVD), or a spin-on process. Afterwards, dry etching or wet etching can be performed to define the contact area for the vertical device.

Figure 2B:
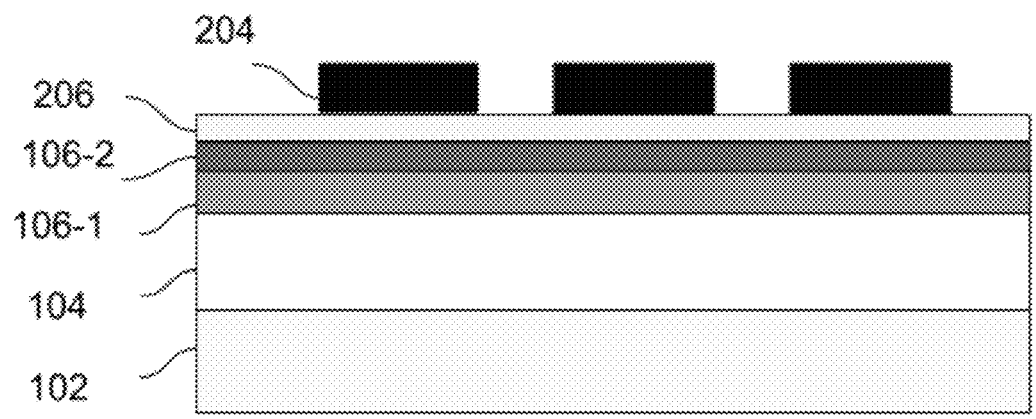

FIG. 2B shows a vertical solid state structure with a patterned photoresist layer deposited on the hard mask layer and the conductive layer. Following the formation of the conductive film, a photoresist layer 204 may be deposited on the hard mask layer 206 and the thick metal layer 106-2. A photoresist layer 204 is deposited on the conductive layer to cover the epitaxial layers and the substrate. The photoresist layer 204 can be patterned with the hard mask layer 206 to define the contact area for the device. In one embodiment, while the photoresist layer can be used to create a mask, it can also be used as a mask layer for etching the underlying layers. The etching process can be dry etch (reactive ion etching (RIP, inductively coupled plasma (ICP), ion milling, etc.) or wet etching.

Figure 2C:
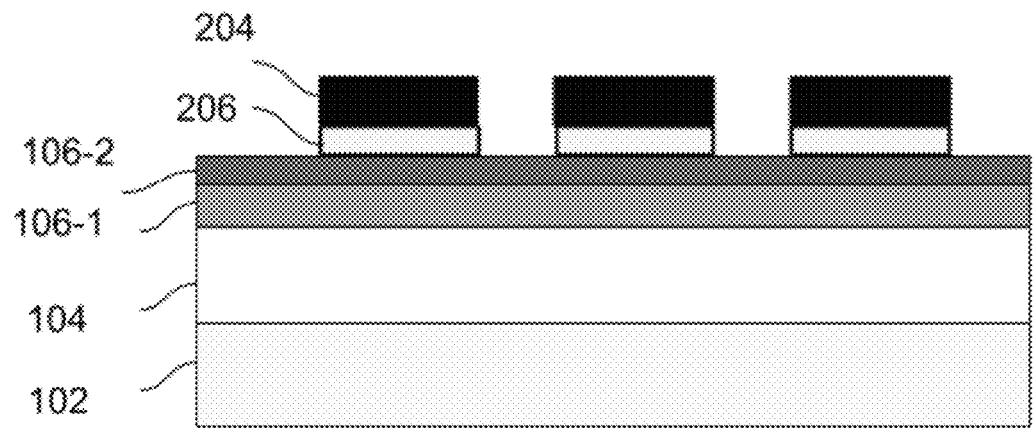
Figure 2D:
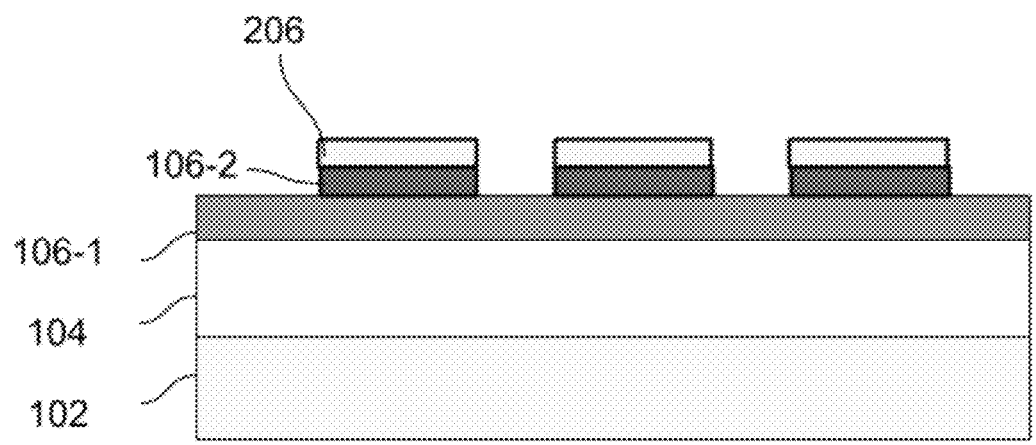

FIGS. 2C-2D show an example of a vertical solid state device substrate after the thick conductive layer 106-2 is patterned using the hard mask layer 206, potentially enabling fewer processing steps and a self-aligned structure. In one embodiment, the patterning may be done through liftoff. This is especially beneficial for devices where the conductive layer resistance manipulation will adversely affect the vertical device performance. Here, the conductive layer thickness is reduced in a selected area to make a higher resistance for the current to flow in the lateral direction.

The device layer may include doped layers at the surface layer that act as current spreading layers or a facilitation for the ohmic contact layer. For further isolation of the device, the doped layers can be etched. Here, the same mask as the previous one can be used to etch the doped layers.

Figure 3:
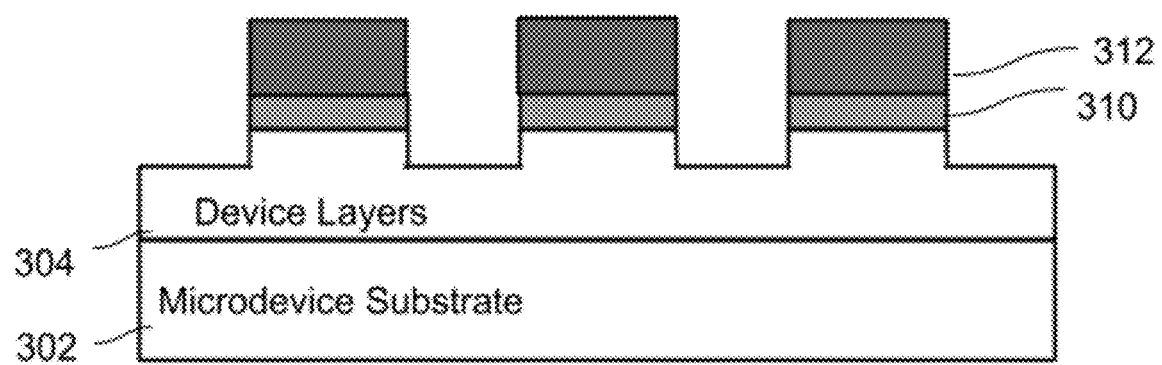
FIG. 3 illustrates the vertical solid state device substrate after patterning the device layers, in accordance with an embodiment of the invention.

FIG. 3 illustrates the vertical solid state device substrate after patterning the device layers, in accordance with an embodiment of the invention. Here, the doped layers are etched. Different etching techniques such as a wet or dry etch process may be employed to define the ohmic contacts of the ohmic contact layer 310. In one embodiment, a physical etching technique such as ion milling may be employed. Here, the ohmic contact layer 310 is extended to the edge of the device layer 304. Also, a wet etching can be used for the contact layer so that it moves the edge of the ohmic contact layers 310 toward the contact layer. A thick conductive layer 312 remains deposited on the ohmic contact layer for precisely mask aligning the other layers.

In one embodiment, a planarization layer may be deposited etching the doped layers. The planarization layer may comprise a polymer layer. The planarization layer is achieved by etching back the polymer layer to the device layers to expose the top surface for connections. In one embodiment, selectively etching only to etch the polymer to a certain level before reaching the device top can be performed. A dry etch method with fluorine chemistry can be employed to selectively etch the polymer layer and other layers. This method can be used with all other structures described here as well.

In another embodiment, a pad and/or bonding layers can be deposited on the top of the current spreading layer.

FIGS. 4A-4D illustrate the deposition of different layers on the vertical solid state device substrate, in accordance with an embodiment of the invention. The hard mask layer may be removed and a plurality of passivation layers and/or different layers surrounding each microdevice may be provided for isolation and/or protection. Additional leveling layers may also be provided to level an upper surface of each microdevice.

In an embodiment, a dielectric layer such as $SiO_2$ or $Si_3N_4$ is deposited on the photoresist layer using appropriate deposition technique to conformally cover a portion of the surface of the said patterned device layer. A variety of deposition techniques such as CVD, PVD, or e-beam deposition may be used to deposit a dielectric layer. In other embodiments, a variety of dielectric layers can be used which include but are not limited to $Si_3N_4$ and oxides such as $SiO_2$, $HfO_2$, $Al_2O_3$, $SrTiO_3$, Al-doped $TiO_2$, $LaLuO_3$, $SrRuO_3$, HfAlO, and/or HfTiOx. The thickness of the dielectric layer may be a few nanometers or micrometers.

Figure 4A:
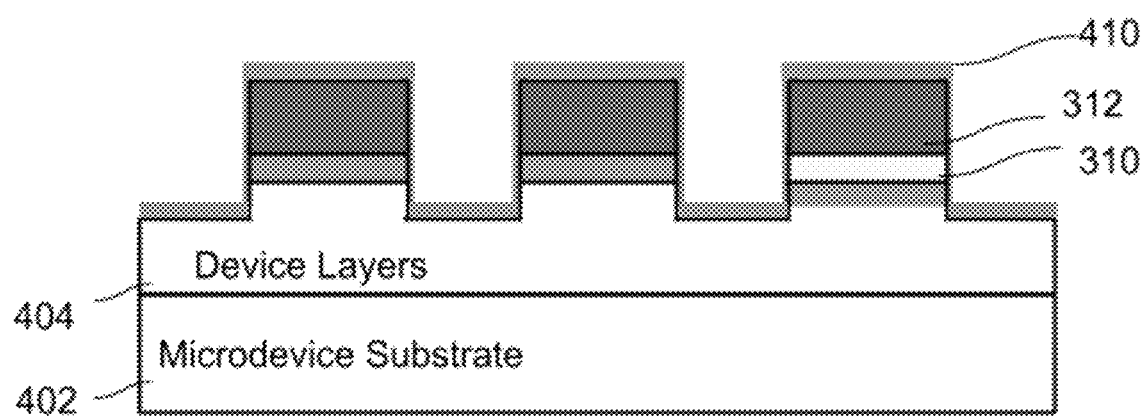
FIGS. 4A-4D illustrate the deposition of different layers on the vertical solid state device substrate, in accordance with an embodiment of the invention.

FIG. 4A shows a passivation layer 410 conformally deposited over a surface of the device layers 404 on the substrate 402 prior to depositing the dielectric layer.

Figure 4B:
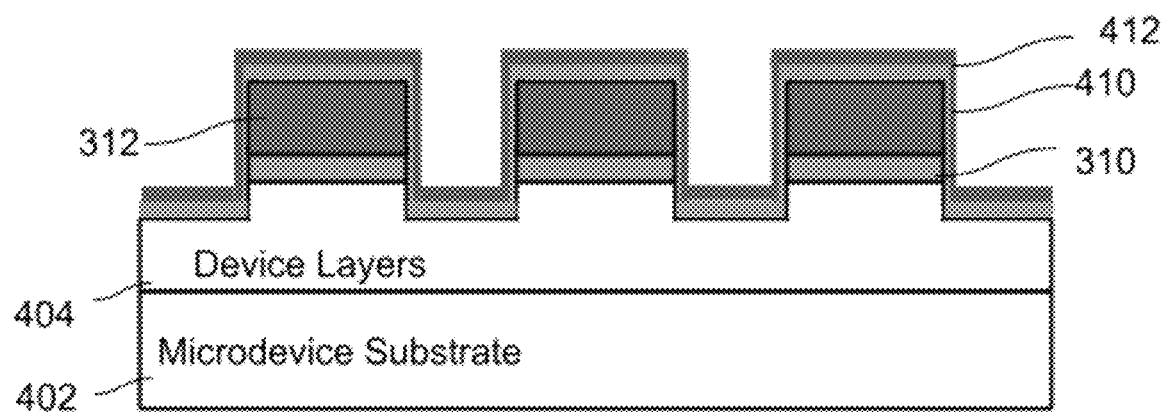

FIG. 4B shows a first dielectric layer 412 deposited after the deposition of the passivation layer.

Figure 4C:
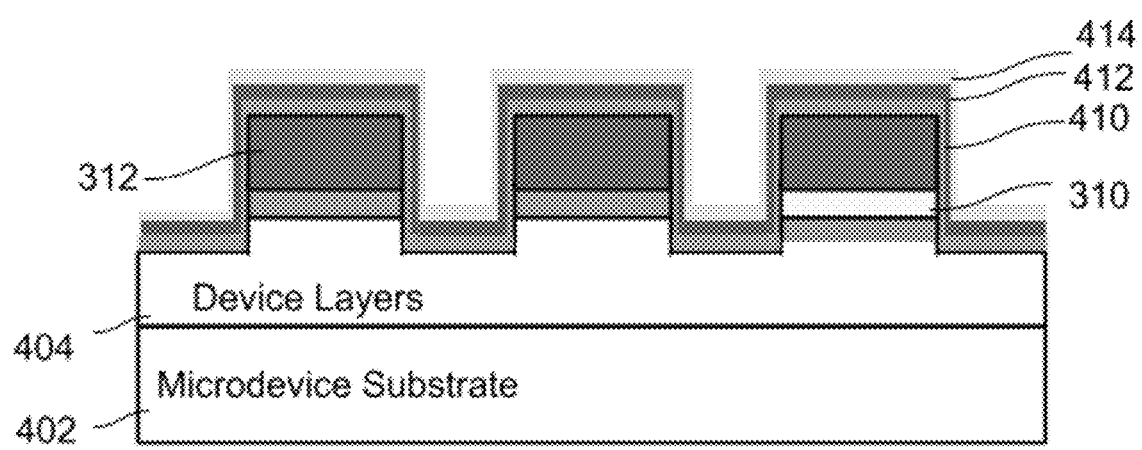

In another embodiment, as shown in FIG. 4C, a conductive layer/metal layer 414 can be deposited after a first dielectric layer(s) 412. A second dielectric layer can be deposited after the conductive layer. The conductive layer can be biased to further isolate the area associated with the contact layer.

Figure 4D:
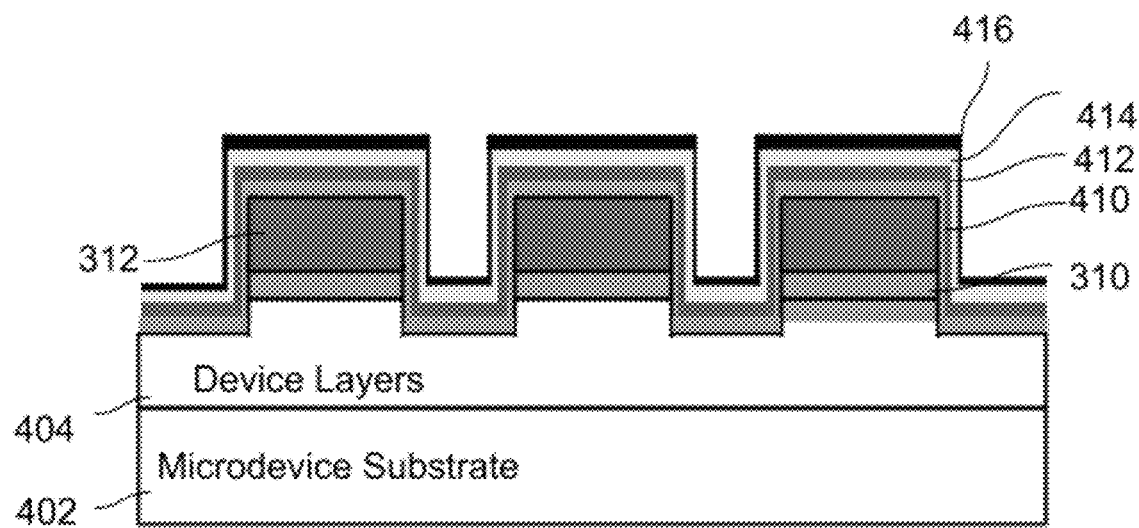

In another embodiment as shown in FIG. 4D, a reflective layer 416 (or black matrix layer) can be deposited after the first dielectric layer(s) 412. These additional layers may be deposited and/or formed between isolated microdevices to enhance device performance. In one example, these additional layers may passivate the sidewalls of the isolated microdevices for better light outcoupling. The microdevices such as but not limited to microLEDs.

In one embodiment, a planarization layer may be deposited after deposition of all the layers over the device layers. The planarization layer may comprise a polymer layer. A planarization layer is needed to level the sidewalls of all the top layers with the surrounding passivation layers. The planarization layer is achieved by etching back the polymer layer to the device layers to expose the top surface for connections. In one embodiment, selectively etching only to etch the polymer to a certain level before reaching the device top can be performed. A dry etch method with fluorine chemistry can be employed to selectively etch the polymer layer and other layers. This method can be used with all other structures described here as well.

Figure 4E:
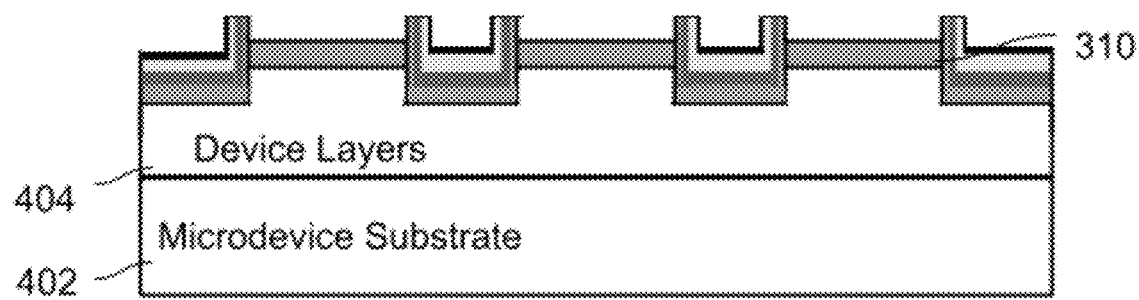
FIG. 4E illustrate self-aligned vertical solid state devices after the liftoff process, in accordance with an embodiment of the invention.

FIG. 4E illustrate self-aligned vertical solid state devices after the liftoff process, in accordance with an embodiment of the invention. After deposition of all the layers, an etching process can be done using, for example, dry etching, wet etching, or laser ablation. In one embodiment, selectively etching only to etch the polymer to a certain level before reaching the device top can be performed. Here, the same mask as the previous one is used to etch the passivation layer, dielectric layers, and conductive layer. Thus, this process enables a simple process that decreases the number of fabrication steps and results in a self-aligned structure.

According to one embodiment, a bottom layer of device layers can be etched afterwards to expose the bottom contacts. The bottom layer may comprises: one of a bottom conductive layer or a bottom doped layer. In one case, the bottom layer is a n-type ohmic layer.

After this stage, other layers can be deposited and patterned depending on the function of the devices. For example, a color conversion layer can be deposited in order to adjust the color of the light produced by the lateral devices and the pixels in the system substrate. A color filter can be also deposited before and/or after the color conversion layer. The dielectric layers in this device can be organic such as polyamide, or inorganic such as SiN, $SiO_2$, $Al_2O_3$, or others. The deposition can be done with different processes such as plasma-enhanced CVD (PECVD), atomic layer deposition (ALD), and other methods. The layer can be a composition of one deposited material or different materials deposited separately or together. The bonding materials can be deposited only as part of the pads of the donor substrate or system substrate pads. There can be some annealing process for some of the layers. For example, the current spreading layer can be annealed depending on the materials. For example, it can be annealed at 500° C. for 10 minutes. The annealing can be done after different steps.

After patterning the device, depending on the patterning process, the device may have straight or sloped walls. The following descriptions are based on selected sloped cases, but similar or modified processing steps can be used for other cases as well. In an embodiment, sidewall passivation during the etching step may be used to create a desired sidewall profile.

Figure 5A:
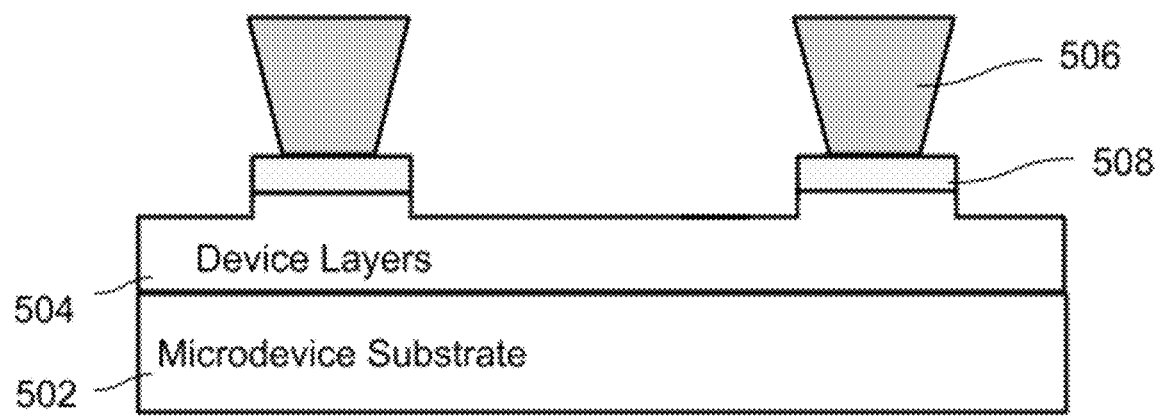
FIG. 5A illustrates another cross-sectional view a vertical solid state structure with a positive slope on a wafer substrate, in accordance with an embodiment of the invention.

FIG. 5A illustrates another cross-sectional view a vertical solid state structure with a positive slope on a wafer substrate, in accordance with an embodiment of the invention. Here, the doped layers are etched. Different etching techniques such as a wet or dry etch process may be employed to define the ohmic contacts of the ohmic contact layer 508. In one embodiment, a physical etching technique such as ion milling may be employed. Here, the ohmic contact layer 508 is extended to the edge of the device layer 504. Also, a wet etching can be used for the contact layer so that it moves the edge of the ohmic contact layers 508 toward the contact layer. A hard mask layer 506 remains deposited on the ohmic contact layer for precisely mask aligning the other layers.

Here, the vertical solid state devices/mesa structures with sloped sidewalls can be formed. Each vertical solid state device comprise positive slope sidewalls. The sloped sidewalls may provide better optical and electrical performance of vertical devices.

Figure 5B:
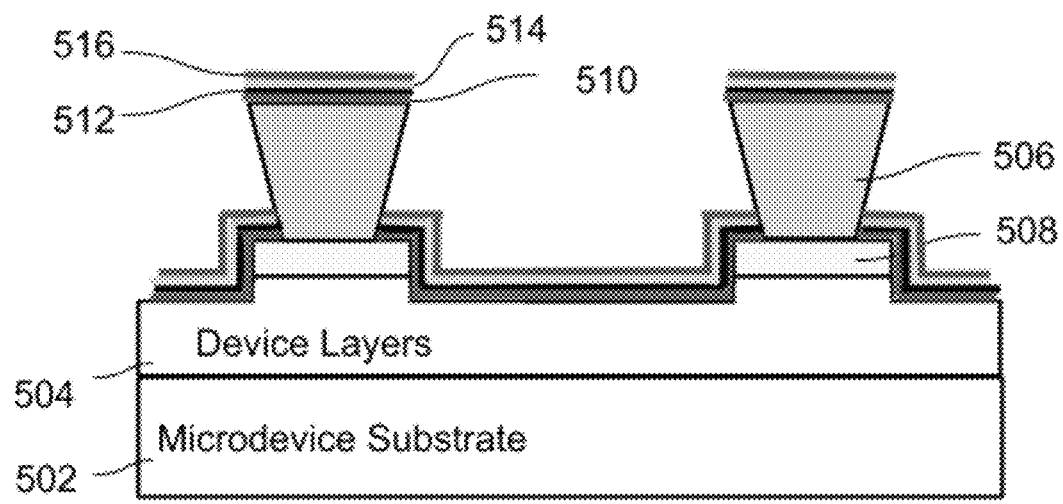
FIG. 5B illustrate deposition of different layers on the vertical solid state devices with the positive slope on the wafer surface, in accordance with an embodiment of the invention.

FIG. 5B illustrate deposition of different layers on the vertical solid state devices with the positive slope on the wafer surface, in accordance with an embodiment of the invention. Here, a passivation layer 510 can be conformally deposited over the surface of the mesa structures 506 prior to depositing the dielectric layer. Afterwards, a first dielectric layer 512 may be deposited after the deposition of the passivation layer. In another embodiment, a conductive/metal layer 514 can be deposited after a first dielectric layer(s) 512. A second dielectric layer can be deposited after the conductive layer. The conductive layer can be biased to further isolate the area associated with the contact layer 508. In another embodiment, a reflective layer 516 (or black matrix layer) can be deposited after the first dielectric layer(s) 512.

Figure 5C:
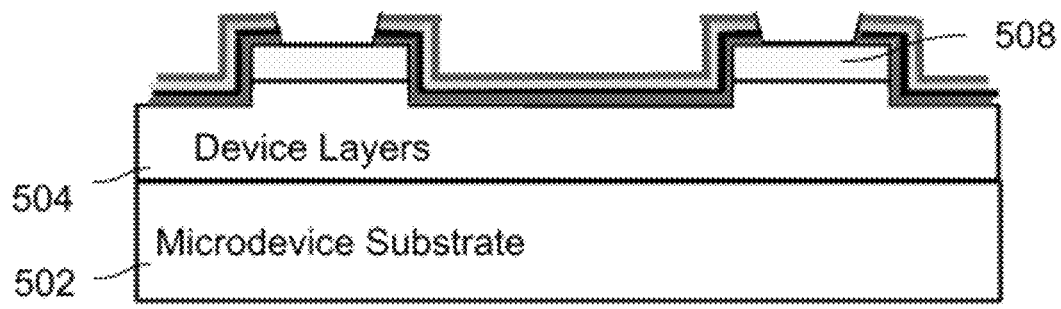
FIG. 5C illustrate self-aligned vertical solid state devices with the positive slope on a wafer substrate after the liftoff process, in accordance with an embodiment of the invention.

FIG. 5C illustrate self-aligned vertical solid state devices with the positive slope on a wafer substrate after the liftoff process, in accordance with an embodiment of the invention. The mask layer is then lifted off (along with the portion of the conductive layer and other layers on the photoresist layer) leaving behind the laterally separate locations of the ohmic contact layer 508 illustrated in FIG. 5B. Here, the same mask as the previous one is used to etch the passivation layer, dielectric layers, and conductive layer. This process enables a simple process that decreases the number of fabrication steps and results in a self-aligned structure.

In another example, a planarization layer can be deposited (annealed) and etched back to expose the head of the contact layer. After this process, either wet or dry etching can be used to remove the extra layers from the top of the layers. This method can be used with all other structures described here as well.

In another embodiment, a wet etch or angular dry etch can be used to move the contact layer away from the edge of the devices. This can reduce the risk of shorting and/or excess light leakage.

Figure 6A:
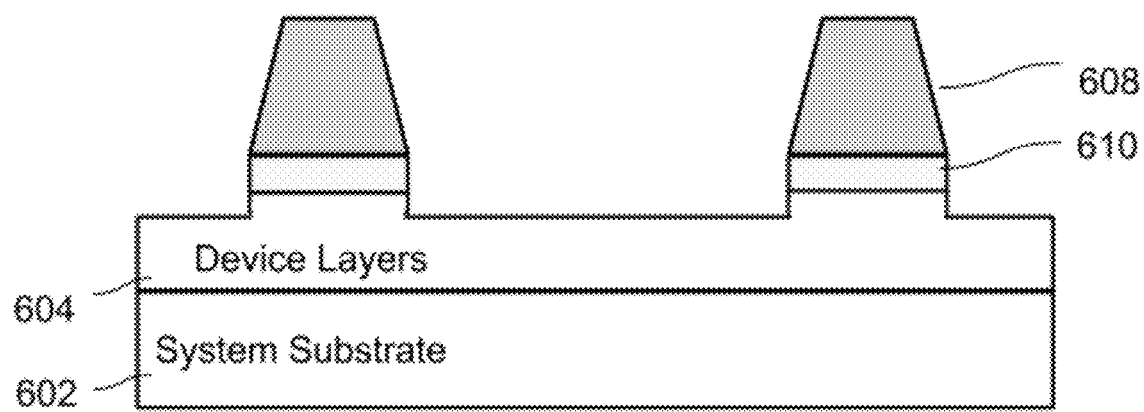
FIG. 6A shows another cross-sectional view a vertical solid state structure with a negative slope on a wafer substrate, in accordance with an embodiment of the invention.

FIG. 6A shows another cross-sectional view a vertical solid state structure with a negative slope on a wafer substrate, in accordance with an embodiment of the invention. Here, the doped layers are etched. Different etching techniques such as a wet or dry etch process may be employed to define the ohmic contacts of the ohmic contact layer 610. In one embodiment, a physical etching technique such as ion milling may be employed. Here, the ohmic contact layer 508 is extended to the edge of the device layer 604. Also, a wet etching can be used for the contact layer so that it moves the edge of the ohmic contact layers 610 towards the contact layer. A hard mask layer 608 remains deposited on the ohmic contact layer for precisely mask aligning the other layers.

Here, the vertical solid state devices/mesa structures with sloped sidewalls can be formed. Each vertical solid state device comprise negative slope sidewalls. The sloped sidewalls may provide better optical and electrical performance of vertical devices.

Figure 6B:
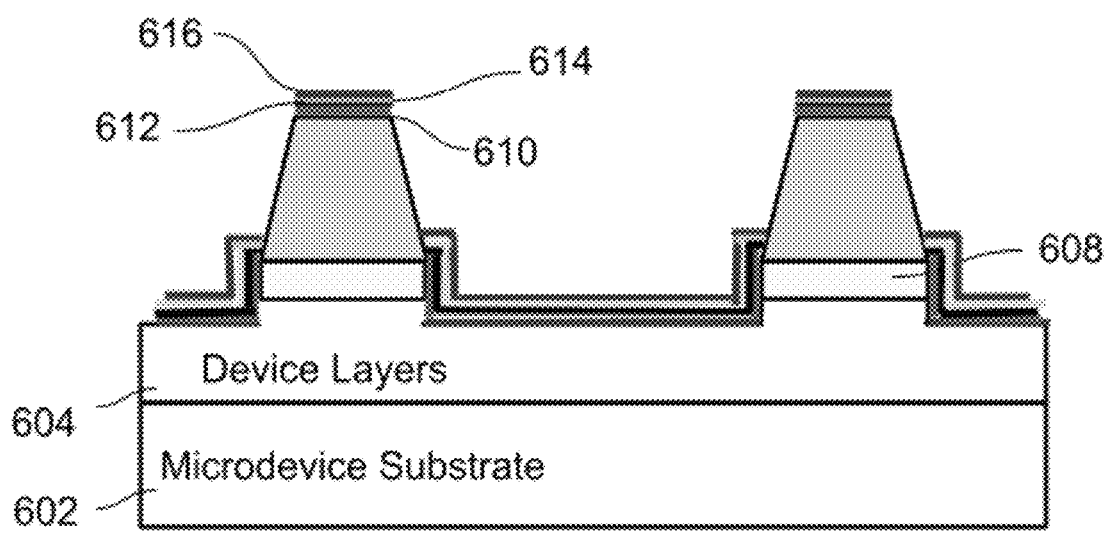
FIG. 6B illustrate deposition of different layers on the vertical solid state devices with the negative slope on the wafer surface, in accordance with an embodiment of the invention.

FIG. 6B illustrate deposition of different layers on the vertical solid state devices with the negative slope on the wafer surface, in accordance with an embodiment of the invention. Here, a passivation layer 610 can be conformally deposited over a surface of the device layer 604 prior to depositing the dielectric layer. Afterwards, a first dielectric layer 612 may be deposited after the deposition of the passivation layer. In another embodiment, a conductive/metal layer 614 can be deposited after a first dielectric layer(s) 612. A second dielectric layer can be deposited after the conductive layer. The conductive layer can be biased to further isolate the area associated with the contact layer 608. In another embodiment, a reflective layer 616 (or black matrix layer) can be deposited after the first dielectric layer(s) 612.

Figure 6C:
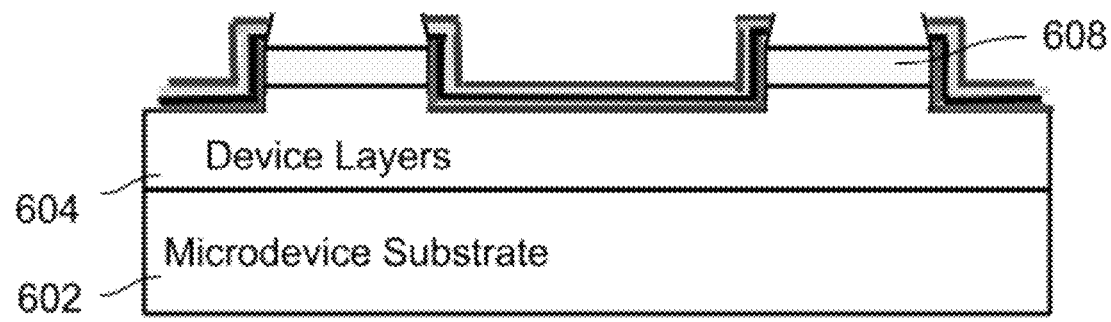
FIG. 6C illustrate self-aligned vertical solid state devices with the negative slope on a wafer substrate after the liftoff process, in accordance with an embodiment of the invention.

FIG. 6C illustrate self-aligned vertical solid state devices with the negative slope on a wafer substrate after the liftoff process, in accordance with an embodiment of the invention. The hard mask layer is then lifted off (along with the portion of the conductive layer and other layers on the photoresist layer) leaving behind the laterally separated locations of the ohmic contact layer 608 illustrated in FIG. 6B. Here, the same mask as the previous one is used to etch the passivation layer, dielectric layers, and conductive layer. This process enables a simple process that decreases the number of fabrication steps and results in a self-aligned structure.

Figure 7:
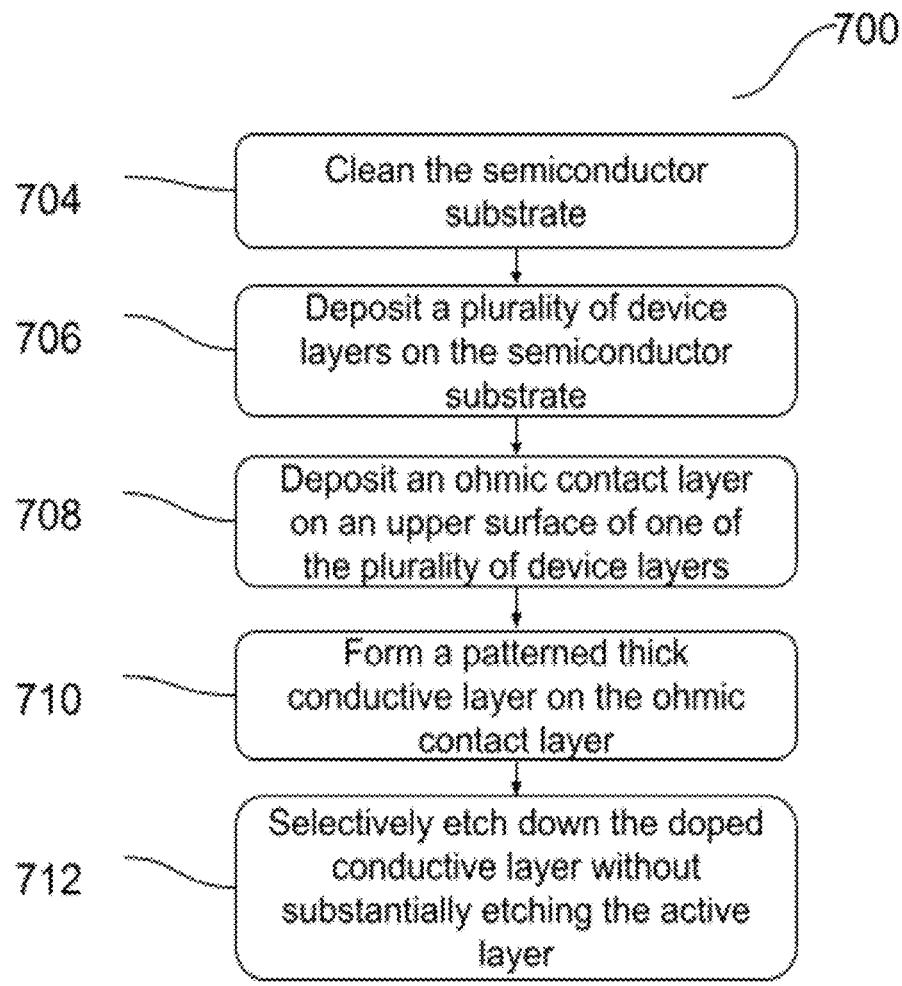
FIG. 7 shows a process flowchart to form a self-aligned structure, in accordance with an embodiment of the invention.

FIG. 7 shows a process flowchart 700 to form a self-aligned structure. In step 704, the wafers are cleaned using piranha etching containing sulfuric acid and hydrogen peroxide followed by a hydrochloric diluted water cleaning step. Step 706 is the deposition of plurality of device layers on the wafer/semiconductor substrate. In step 708, an ohmic contact layer on an upper surface of one of the plurality of device layers is deposited. In step 710, a patterned thick conductive layer on the ohmic contact layer may be provided. In step 712, a selectively etching down the doped conductive layer that does not substantially etch the active layer is performed.

Figure 8:
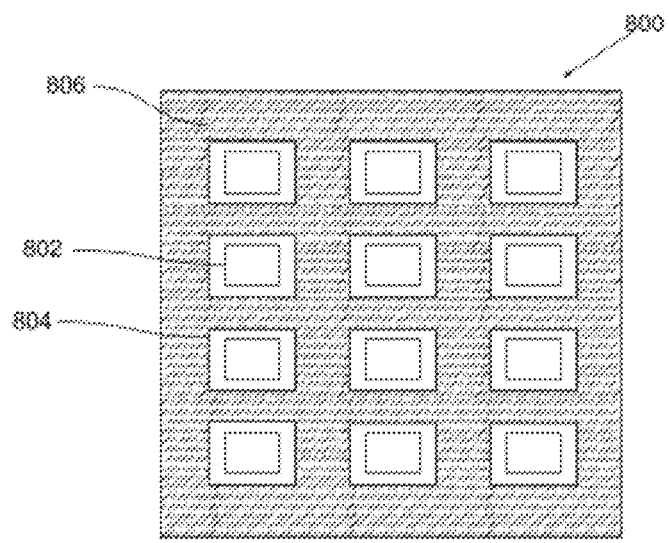
FIG. 8 shows a top view of a plurality of self-aligned vertical solid state devices on the substrate, in accordance with an embodiment of the invention.

FIG. 8 shows a top view of a plurality of a self-aligned vertical solid state devices on the substrate. These self-aligned vertical solid state devices 800 are formed by one of the methods described above. The microdevices 802 are surrounded by a planarization layer 806 and the planarization layer is etched 804 at the top of microdevices.

Some embodiments of the present disclosure provide a method of manufacturing an optoelectronic panel comprising integrating an array of microdevices fabricated on a wafer structure with the contact pads of a system substrate. The fabrication process which is discussed above facilitates self-alignment and integration of microdevices into the system substrate.

The process of integration of microdevices into a system substrate involve development and preparation of array of microdevices on a donor substrate followed by electrically or mechanically bonding of the microdevices with the system substrate. In this embodiment, microdevices may be of the same type or different types in terms of functionality and the system substrate is the backplane, controlling individual microLEDs.

As shown in the above embodiments, an LED wafer consists of isolated individual LED devices. These microdevices need to bond to the system substrate or to a backplane. The alignment between the two substrates (i.e. wafer substrate and system substrate) is challenging because of the size of microdevices. The self-aligned structures fabricated by above processes enhance the number of working microLEDs that can eliminate misalignment potential. The contact pads on the system substrate can be larger and hold different number of LEDS. The contact pads on the system substrate can have larger pitch as compared to the pitch of microdevices. In one case, the pitch of contact pads is at least two times larger than the pitch of microdevices.

According to one aspect of the invention, the bonding between the microdevices and system substrate provides uniform, reliable and hermetically sealed (bubble free) bonding.

According to another embodiment, there is provided a method of bonding pre-fabricated microdevices with contact pads of the system substrate. The method may comprising: fabricating an array of microdevices on a semiconductor substrate, providing a system substrate with contact pads where a pitch of the microdevice array is smaller than a pitch of the contact pads on the system substrate, approximately aligning the array of microdevices on the semiconductor substrate with the contact pads on the system substrate; and bonding the microdevices to the system substrate.

Figure 9A:
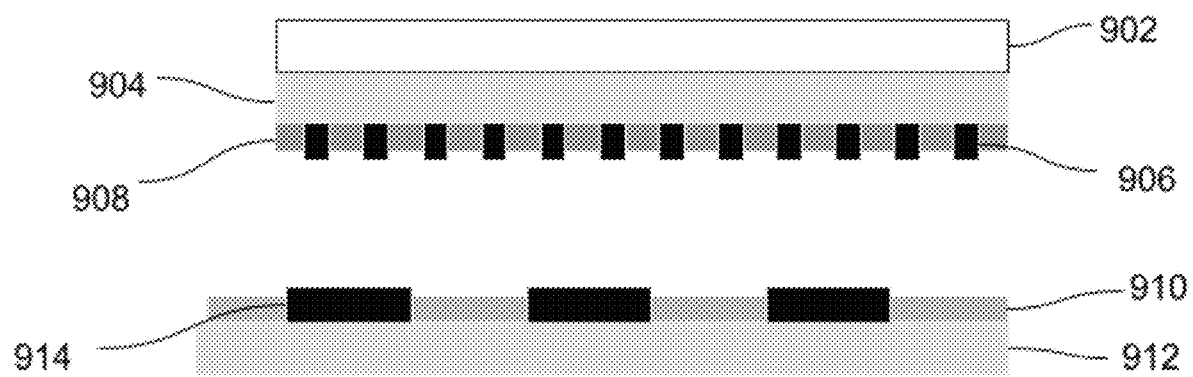
FIGS. 9A-9C show bonding of microdevices facilitating self-alignment with contact pads on the system substrate, in accordance with an embodiment of the invention.

FIG. 9A shows step of aligning the wafer substrate and the receiver substrate, in accordance with an embodiment of the invention. In FIG. 9A, an array of microdevices 906 are fabricated on a wafer substrate/semiconductor substrate 902. A plurality of device layers are formed on top of the wafer substrate. The device layers 904 may comprise a buffer layer, a polymer layer, conductive/metal layer(s), a passivation layer, and/or a dielectric layer. The fabrication process of microdevice array is described in the above embodiments.

To isolate the individual microdevices, a planarization layer 908 may be deposited on top of the microdevices 906. The planarization layer 908 may comprise a polymer or an adhesive film layer. The planarization layer 908 may be patterned and etched back using dry or wet etching techniques to expose the top surface of the microdevices 906.

In FIG. 9A, a system substrate/receiver substrate 912 is provided. The system substrate is approximately aligned with the wafer substrate 902 for bonding. A plurality of contact pads 914 may be provided on the receiver substrate. A pitch of the microdevice array is smaller than a pitch of the contact pads on the system substrate. A planarization layer 910 may be deposited and patterned between the contact pads. The planarization layer may comprise a polymer layer or an adhesive film layer. For better self-alignment, the pitch on backplane is more than twice larger than the pitch of the micro device array.

The contact pads may be made larger to accommodate a large number of microdevices. In one case, the pitch of the contact pads is at least two times larger than the pitch of microdevices. The contact pads on the system substrate 912 equipped with a mechanism to electrostatically hold the microdevices during bonding. As an example, the microdevices can be microLED devices and the receiver substrate can be the backplane driver circuitry and the contact pads are coupled to the driving circuitry.

In one embodiment, another planarization layer 910 is formed between the contact pads 914 of the system substrate 912.

In one case, the system substrate 912 having contact pads 914 can be aligned and bonded to the microdevice substrate 902.

Figure 9B:
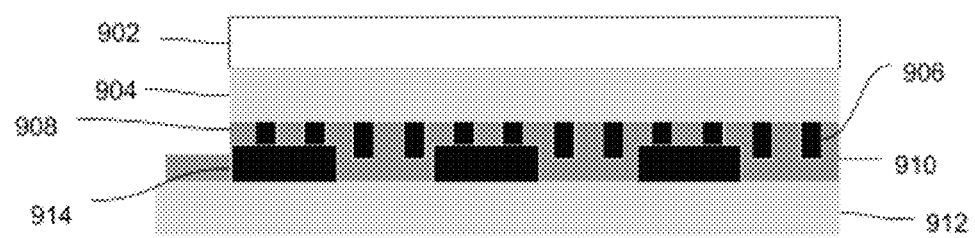

FIG. 9B shows a cross-section of bonding the microdevice substrate with the system substrate, in accordance with an embodiment of the invention. Here, the microdevices 906 are bonded to contact pads 914 on the receiver substrate. The microdevices fabricated on a wafer structure facilitates the self-alignment of microdevices with the contact pads of the system substrate. The bonding between the two substrates provide a reliable and hermetically sealed (bubble free) bonding.

Figure 9C:
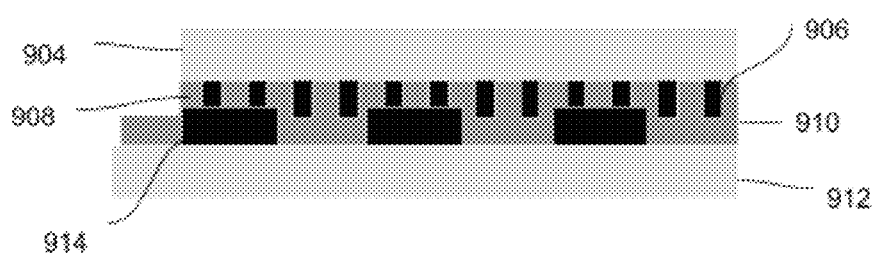

FIG. 9C shows step of removing the wafer substrate after bonding, in accordance with an embodiment of the invention. The bonding process involves bonding the array of micro devices to the receiver substrate followed by removing the donor substrate. The donor substrate is removed from the receiver substrate using a laser liftoff process.

This integration process provides a uniform reliable bonding between the substrates. The device layers 904 may be thinned afterwards.

According to one embodiment, there is provided a method of fabricating a self-aligned vertical solid state device. The method may comprising depositing a plurality of device layers on the semiconductor substrate, depositing an ohmic contact layer on an upper surface of one of the plurality of device layers, wherein the device layers comprises an active layer and a doped conductive layer, forming a patterned thick conductive layer on the ohmic contact layer; and selectively etching down the doped conductive layer that does not substantially etch the active layer.

In another embodiment, the forming of patterned thick conductive layer may comprising depositing a masking layer over the thick metal layer; depositing a patterned photoresist layer on the masking layer; and patterning the thick conductive layer using the masking layer.

In some embodiments, the ohmic contact layer comprises an indium tin oxide layer as another ohmic contact.

In one embodiment, the method may further comprising removing the masking layer, depositing a plurality of another layers conformally over the device layers; and patterning the deposited other layers over the device layers to remove extra layers from the top of the plurality of the patterned thick conductive layer. The plurality of other layers comprising: one or more passivation layers, polymer layers, dielectric layers, conductive layers and reflective layers.

In another embodiment, the method may further comprising etching a bottom layer of one of the plurality of device layers to expose the bottom contacts, wherein the bottom layer comprises: one of a bottom conductive layer or a bottom doped layer. The bottom layer is a n-type ohmic layer. The vertical solid state device is a microLED device.

In another embodiment, there is provided a method of manufacturing an optoelectronic panel. The method may comprising fabricating an array of microdevices on a semiconductor substrate, providing a system substrate with contact pads where a pitch of the microdevice array is smaller than a pitch of the contact pads on the system substrate, approximately aligning the array of microdevices on the semiconductor substrate with the contact pads on the system substrate; and bonding the microdevices to the system substrate.

In one case, the pitch of contact pads is at least two times larger than the pitch of microdevices.

In one embodiment, a planarization or passivation layer is formed between the microdevices. The patterned planarization layer comprises a polymer layer or an adhesive film layer. Another planarization layer is formed between the contact pads of the system substrate and the system substrate comprises a driving circuitry and the contact pads are coupled to the driving circuitry.

In another embodiment, the method may further comprising removing the semiconductor substrate using a laser liftoff process.

While the present disclosure is susceptible to various modifications and alternative forms, specific embodiments or implementations have been shown by way of example in the drawings and are described in detail herein. It should be understood, however, that the disclosure is not intended to be limited to the particular forms disclosed. Rather, the disclosure is to cover all modifications, equivalents, and alternatives falling within the spirit and scope of the invention as defined by the appended claims.

We claim:

1. A method of fabricating a self-aligned vertical solid state device, the method comprising:
   providing a substrate;
   depositing a plurality of device layers on the substrate;
   depositing an ohmic contact layer on an upper surface of one of the plurality of device layers, wherein the plurality of device layers comprises an active layer and a doped conductive layer;
   depositing a metal conductive layer on top of the ohmic contact layer or the doped conductive layer;
   patterning the metal conductive layer;
   patterning the doped conductive layer, the doped conductive layer comprising a hard masking layer and a photoresist layer by depositing the hard masking layer over the metal conductive layer, depositing a patterned photoresist layer on the hard masking layer, to cover an epitaxial layer and the substrate, and patterning the metal conductive layer using the hard masking layer to define a contact area of the device;
   depositing conformally a passivation layer covering the upper surface of the plurality of device layers and other layers formed on the surface;
   removing back the passivation layer to expose a top of the metal conductive layer;
   etching the passivation layer or the dielectric layer formed on the top of the metal conductive layer;
   removing the hard masking layer;
   depositing a first dielectric layer on the photoresist layer;
   depositing another conductive layer after the first dielectric layer;
   depositing a second dielectric layer after the deposition of the other conductive layer; and
   biasing the other conductive layer to isolate an area associated with the ohmic contact layer.

2. The method of claim 1, wherein the ohmic contact layer comprises an indium tin oxide layer as another ohmic contact.

3. The method of claim 1, further comprising:
   depositing a plurality of other layers conformally over the plurality of device layers after removing the hard masking layer;
   wherein the deposited other layers are patterned over the plurality of device layers to remove extra layers from a top of a plurality of patterned conductive layers.

4. The method of claim 3, wherein the plurality of other layers comprising:
   one or more passivation layers, polymer layers, dielectric layers, conductive layers and reflective layers.

5. The method of claim 1, further comprising
   etching a bottom layer of one of the plurality of device layers to expose bottom contacts, wherein the bottom layer comprises: one of a bottom conductive layer or a bottom doped layer.

6. The method of claim 5, wherein the bottom layer is a n-type ohmic layer.

7. The method of claim 1, wherein the vertical solid state device is a microLED device.

8. The method of claim 1, wherein the etching is a wet etching, a dry etching or a laser ablation.

9. The method of claim 1, wherein the fabricated self-aligned vertical solid state device comprises straight walls or sloped walls.

* * * * *